USOO5122846A

United States Patent [19]
Haken

[11] Patent Number: 5,122,846
[45] Date of Patent: Jun. 16, 1992

[54] BISTABLE LOGIC DEVICE USING TRENCH TRANSISTORS

[75] Inventor: Roger A. Haken, Dallas, Tex.

[73] Assignee: Texas Instruments Incorporated, Dallas, Tex.

[21] Appl. No.: 675,237

[22] Filed: Mar. 26, 1991

Related U.S. Application Data

[63] Continuation of Ser. No. 444,503, Jan. 25, 1990, abandoned.

[51] Int. Cl.⁵ .............................................. H01L 29/10
[52] U.S. Cl. ................... 357/23.4; 357/23.6; 357/41; 357/42; 357/45; 357/55
[58] Field of Search ................. 357/23.4, 23.6, 41, 357/42, 45, 55

[56] References Cited

U.S. PATENT DOCUMENTS

| | | | |
|---|---|---|---|
| 4,214,917 | 7/1980 | Clark et al. | 357/23 |
| 4,653,025 | 3/1987 | Minato et al. | 357/23.7 |
| 4,794,561 | 12/1988 | Hsu | 357/23.4 |
| 4,835,589 | 5/1989 | Pfiester | 357/23.6 |
| 4,881,105 | 11/1989 | Davari et al. | 357/42 |

Primary Examiner—Edward J. Wojciechowicz
Attorney, Agent, or Firm—Richard L. Donaldson; William E. Hiller; Ronald O. Neerings

[57] ABSTRACT

The described embodiments of the present invention show a structure and process for fabricating this structure in which a bi-stable logic device, such as a static random access memory cell, is formed. The advantages of the described embodiments are most particularly found when in an array. In two parrallel lines formed in buried diffusions beneath the surface of the integrated circuit, $V_{dd}$ or the power supply voltage and ground are alternately provided. Two vertical transistors control conduction between ground and a surface diffusion are formed being connected to the buried ground diffusion. Two additional transistors are formed as load devices connected between the surface diffusion and the $V_{dd}$ buried diffusion. The surface diffusion is connected to complementary bit lines via access transistors formed connecting the surface diffusion to contact points for the complementary bit lines. By using buried ground and supply lines, large space savings may be obtained with the present memory cell. In addition, because of the vertical structure of all devices inthe memory cell, increased soft error immunity is obtained. Further space savings are achieved by the use of local interconnect processing for forming interconnections between surface devices in the cells. In another embodiment, a buried diffusion is used as an interconnection node for a bi-stable device using vertical devices.

58 Claims, 6 Drawing Sheets

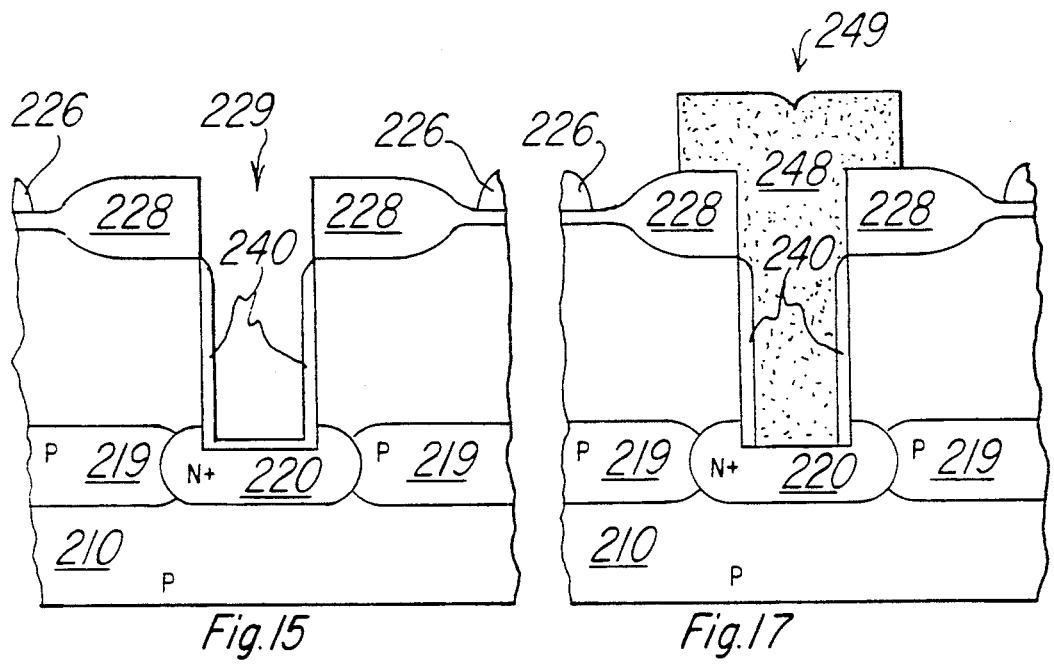
Fig.15
Fig.17
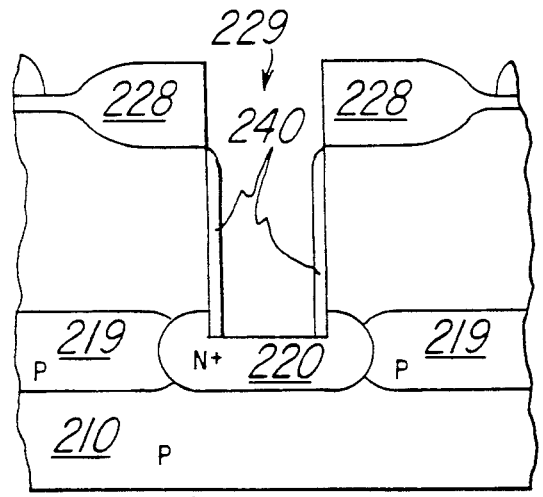
Fig.16
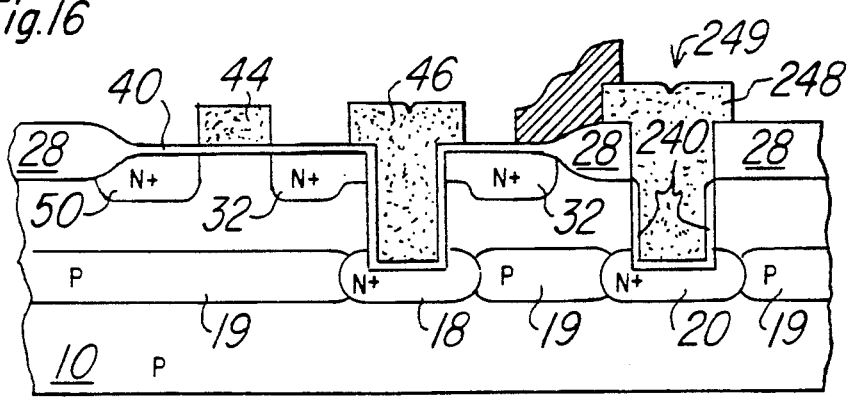
Fig.18

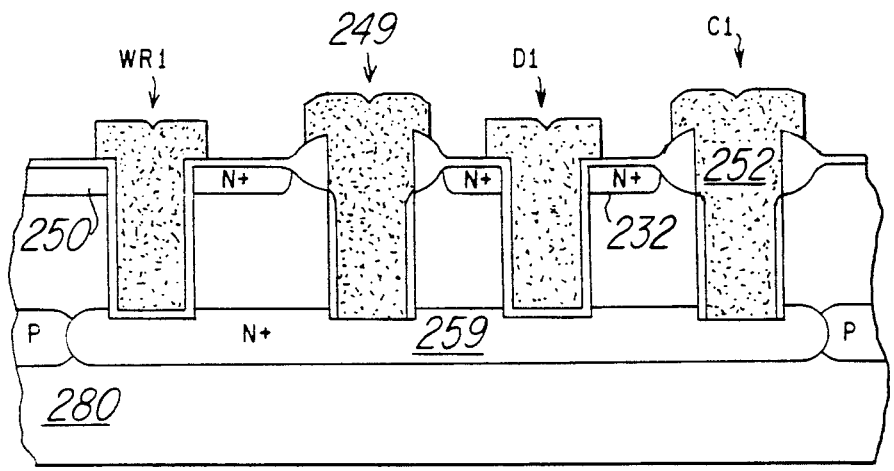
Fig.19
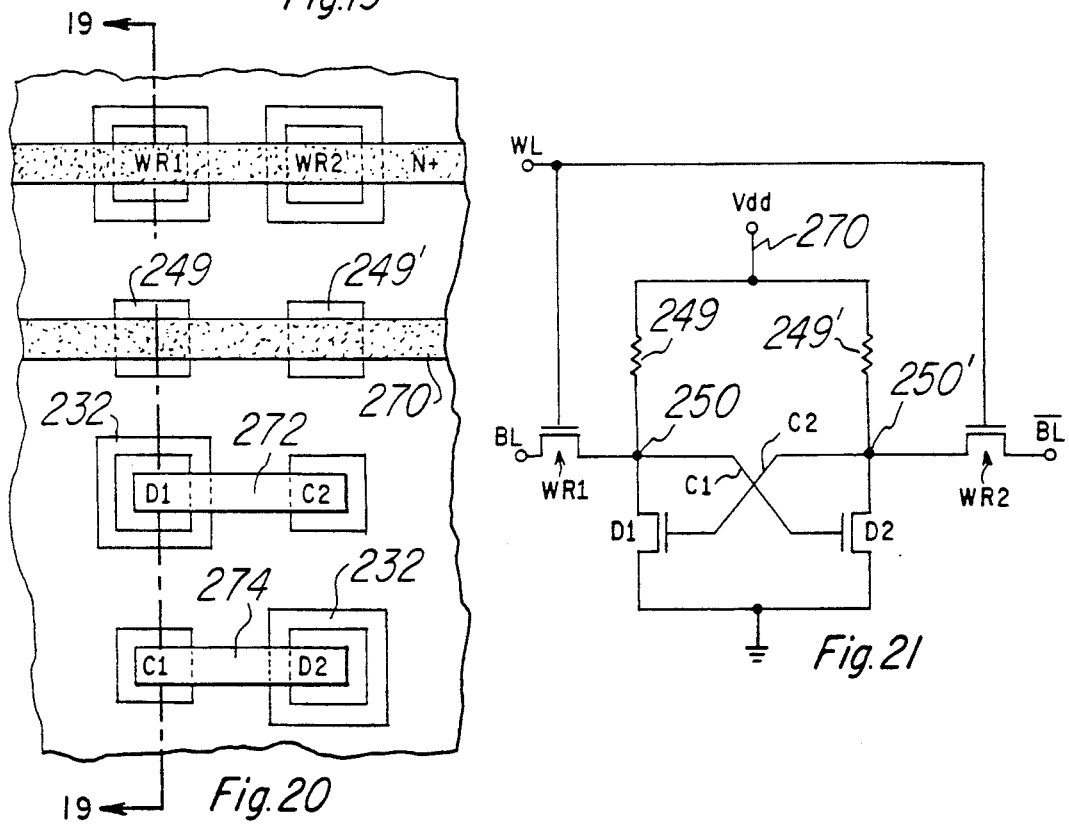
Fig.20
Fig.21

BISTABLE LOGIC DEVICE USING TRENCH TRANSISTORS

This application is a continuation of application Ser. No. 07/444,503, filed Jan. 25, 1990, now abandoned.

FIELD OF THE INVENTION

The present invention relates to the field of integrated circuit design and manufacturing. More specifically, the present invention relates to circuits and structures using vertical devices to optimize device density.

BACKGROUND OF THE INVENTION

A constant goal in integrated circuit fabrication is increased numbers of active components in a single integrated circuit. This can be accomplished by several techniques, but the most useful technique is minimizing the area required for particular devices in the integrated circuit. One type of circuit in which this is extremely beneficial is memory circuits. In memory circuits, data is stored in specific memory cells and the access of these memory cells is controlled by peripheral circuitry. To store a large amount of data in the memory chip, a large number of memory cells must be provided. The memory cells used in a particular integrated circuit are usually of the same type, so that area savings in the memory cell design yields large area savings in the integrated circuit as a whole. With this area savings, additional memory may be put onto a single chip or additional processing margins may be added to the process to allow for higher reliability and greater yields.

One type of memory in which space savings may be achieved by small memory cell design is the static random access memory (SRAM). In most SRAMs, each memory cell is a data latch. The usual structure of the data latch is cross-coupled inverters. Cross-coupled inverters have the output of one inverter driving the input of the other inverter and vice versa. Thus, a logical 1 or logical 0 input signal is maintained on the latch by feedback between inverters. The simplest of inverter structures is a transistor with a load device connected between the power supply and the drain and the source connected to ground. The input terminal is provided by the gate. To complete a latch, the gate of one inverter is connected to the drain of the other inverter and vice versa.

Most SRAM cells also include transfer transistors which isolate the SRAM cell when not being accessed. This prevents data being written to other cells from interfering with the data stored on a non-accessed memory cell. Thus, the normal memory cell requires four transistors and two load devices, which may be transistors. These devices have been implemented in many different ways. For example, in Minami, et al., "A New Soft Error Immune Static Memory Cell" *VLSI Sympossium*, p. 57 (1988), a specific memory cell using a resistor and a vertical driver transistor for greater immunity to alpha particles is described. The vertical transistor shown in FIG. 2B of Minami, et al. allows some space savings and the desired alpha particle immunity. However, the cell of Minami, et al. uses a resistor with the above-discussed area limitations.

SUMMARY OF THE INVENTION

The described embodiments of the present invention show a structure and process for fabricating this structure in which a bi-stable logic device, such as a static random access memory cell, is formed. The advantages of the described embodiments are most particularly found when in an array. In two parallel lines formed in buried diffusions beneath the surface of the integrated circuit, $V_{dd}$ or the power supply voltage and ground are alternately provided. Two vertical transistors control conduction between ground and a surface diffusion are formed being connected to the buried ground diffusion. Two additional transistors are formed as load devices connected between the surface diffusion and the $V_{dd}$ buried diffusion. The surface diffusion is connected to complementary bit lines via access transistors formed connecting the surface diffusion to contact points for the complementary bit lines. By using buried ground and supply lines, large space savings may be obtained with the present memory cell. In addition, because of the vertical structure of all devices in the memory cell, increased soft error immunity is obtained. Further space savings are achieved by the use of local interconnect processing for forming interconnections between surface devices in the cells. In another embodiment, a buried diffusion is used as an interconnection node for a bi-stable device using vertical devices.

DESCRIPTION OF THE DRAWINGS

FIGS. 15 through 17 are side view schematic diagrams showing the processing steps for forming a vertical connection or resistor from the surface to a buried layer;

FIG. 18 is a side view schematic diagram of the embodiment of FIG. 12 where the load transistor has been replaced by a vertical resistor;

FIG. 19 is a side view schematic diagram of another embodiment of the present invention;

FIG. 20 is a plan view of the embodiment shown in FIG. 19; and

FIG. 21 is an electrical schematic diagram of the embodiment of FIGS. 19 and 20.

DETAILED DESCRIPTION

Figure 11:
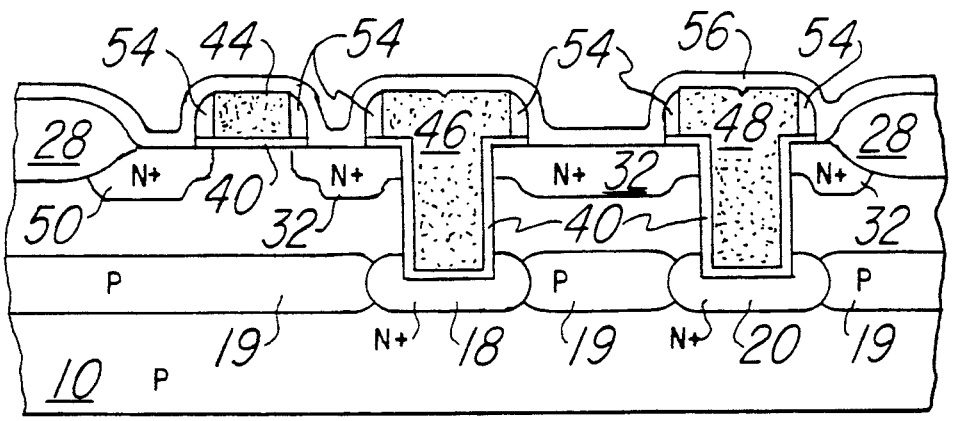
Figure 12:
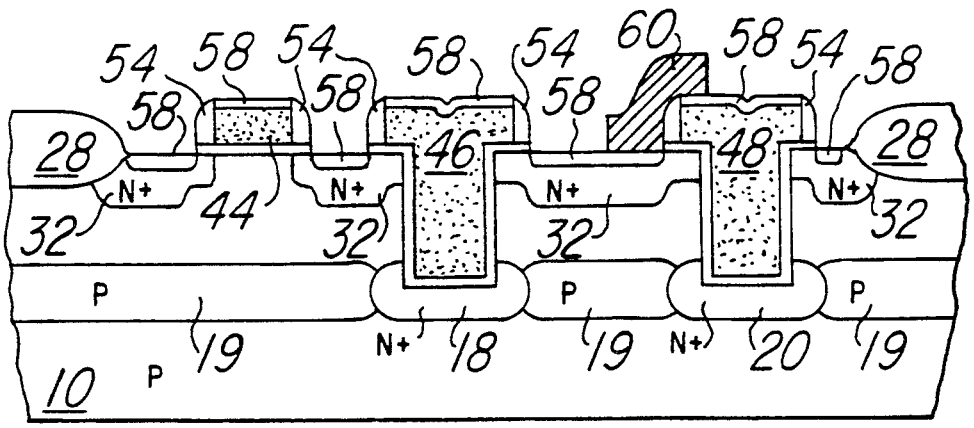
Figure 13:
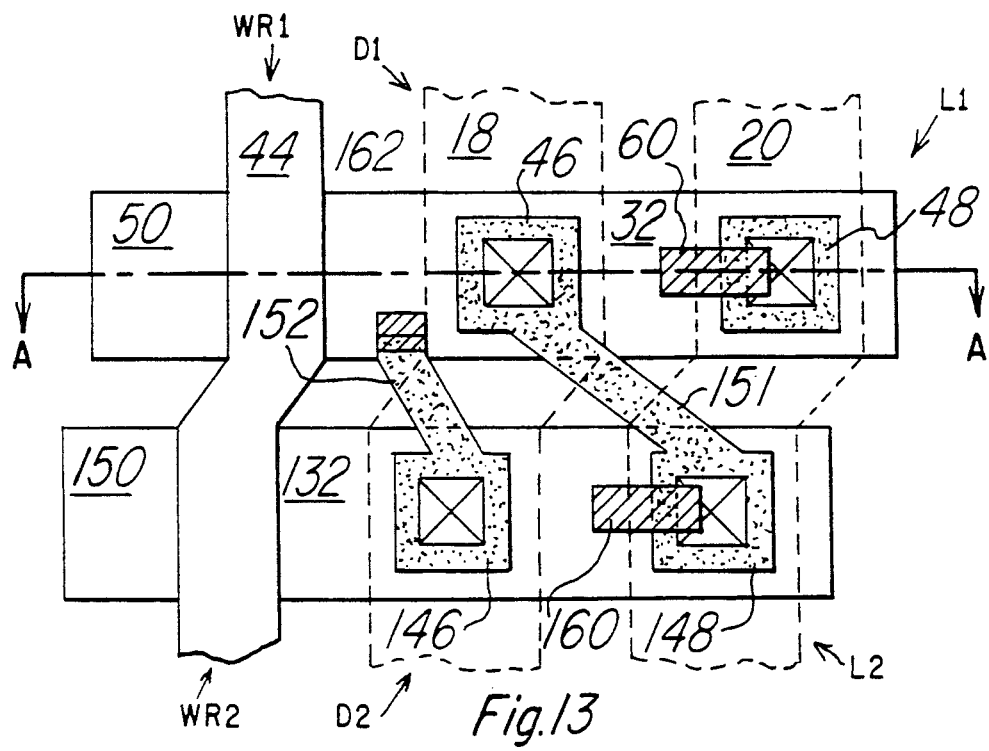
FIG. 13 is a plan view showing the layout of the memory cell which is one embodiment of the present invention including the devices fabricated using the processing steps shown in FIGS. 1 through 12.
Figure 14:
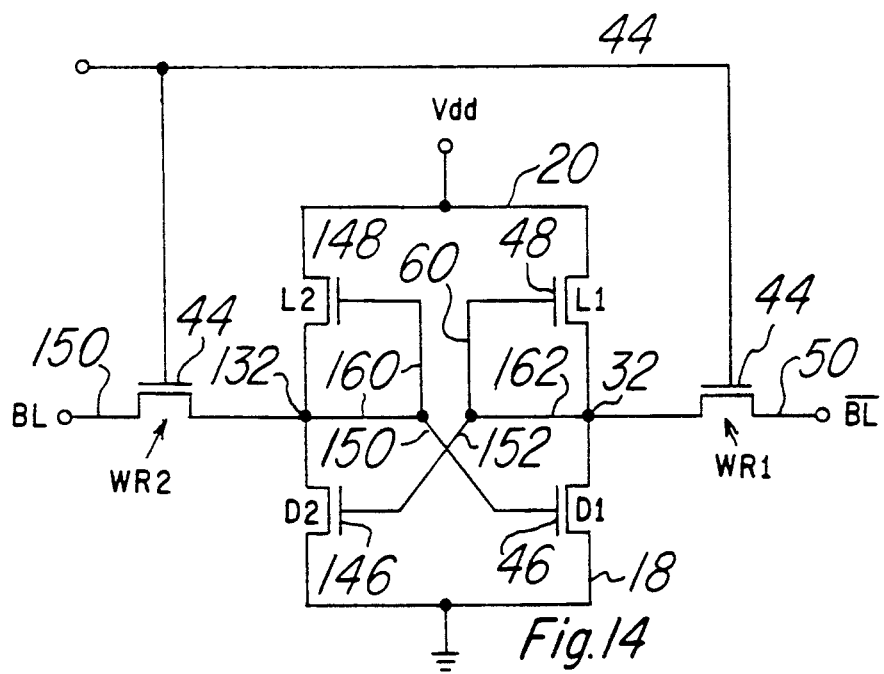
FIG. 14 is an electrical schematic diagram showing the electrical operation of the memory cell of FIG. 13.

FIGS. 1 through 12 are side view schematic diagrams depicting the processing steps, which are one embodiment of the present invention, for fabricating one portion of the static random access memory cell, which is another embodiment of the present invention. As the devices in FIGS. 1 through 12 are fabricated, a parallel set of devices are fabricated which are interconnected as shown in FIG. 13 to provide a static random access memory cell. FIG. 14 shows the electrical characteristics of the devices of FIG. 13.

Figure 1:
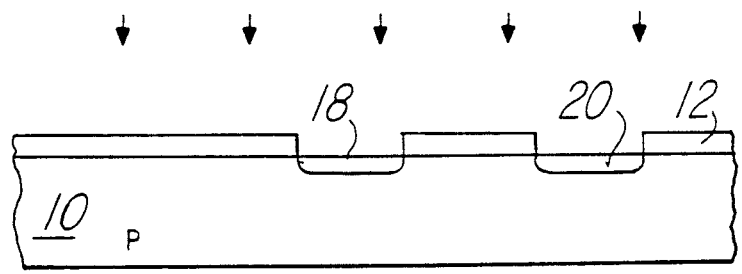
FIGS. 1 through 12 are side view schematic diagrams showing the processing steps for fabricating a portion of a memory cell which is one embodiment of the present invention.

The process starts with a single crystal silicon substrate 10 which is doped P type as shown in FIG. 1. A layer of silicon dioxide 12 is formed using thermal oxidation in a steam ambient at approximately 900° C. for approximately 4 hours and 51 minutes to a thickness of approximately 5,000 Angstroms. Using common photolithographic techniques, silicon dioxide layer 12 is patterned and etched to provide the structure shown in FIG. 1. The structure of FIG. 1 is then subjected to an ion implantation of antimony ions having an energy of approximately 40 kiloelectron volts at a density of approximately $3.0 \times 10^{15}$ ions/centimeter$^2$. This forms doped regions 18 and 20, as shown in FIG. 1.

Figure 2:
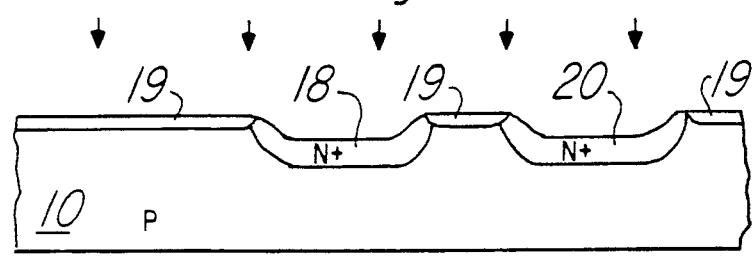
Figure 3:
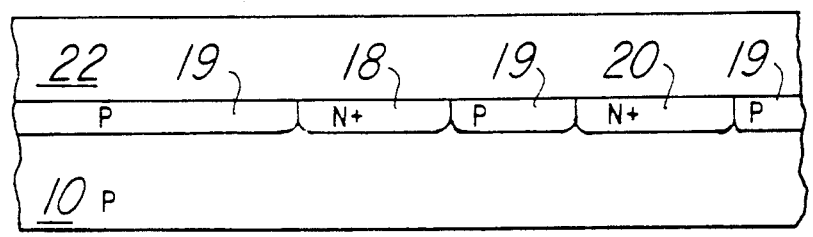

The structure of FIG. 1 is then subjected to thermal oxidation in an $N_2/O_2$ environment at a temperature of approximately 1,250° C. for approximately 30 minutes. This forms a thick oxide layer (not shown) over doped regions 18 and 20 and thin silicon dioxide layer (not shown) elsewhere due to the enhanced oxidation of doped regions 18 and 20, and the oxidation inhibition effect of silicon dioxide layer 12. These silicon dioxide layers are stripped using buffered HF leaving the structure of FIG. 2. The structure of FIG. 2 is then subjected to an ion implantation of boron ions at an energy of approximately 120 to 160 kiloelectron volts at a density of approximately $4 \times 10^{12}$ to $1 \times 10^{13}$ ions/centimeters$^2$. This ion implantation is not heavy enough to counterdope doped regions 18 and 20, and the antimony ions tend to "lock up" the boron. Thus doped regions 18 and 20 are relatively unaffected by this ion implantation. The boron ions are activated to form P doped regions 19 as shown in FIG. 2. This process is more completely described in copending U.S. patent application Ser. No. 265,074, which is assigned to the assignee of this application and which is hereby incorporated by reference. An epitaxial layer 22 is then formed on the surface of the structure FIG. 2 to provide the structure as shown in FIG. 3. Although the structure of FIG. 3 shows a smooth surface over P+ regions 19 and N+ regions 18 and 20, in actuality, the surface will be rather rough providing topography for the alignment of subsequent photomasks. The surface is shown as smooth for simplicity of the drawings.

The present embodiment is preferably incorporated in a bipolar/complementary metal-oxide-semiconductor (BiCMOS) integrated circuit. The fabrication of other devices in the integrated circuit requires other steps which are not shown, such as the formation of N-wells. The processing details for these other components may be found in copending U.S. application Ser. No. 129,261, which is assigned to the assignee of this application and which is hereby incorporated by reference.

Figure 4:
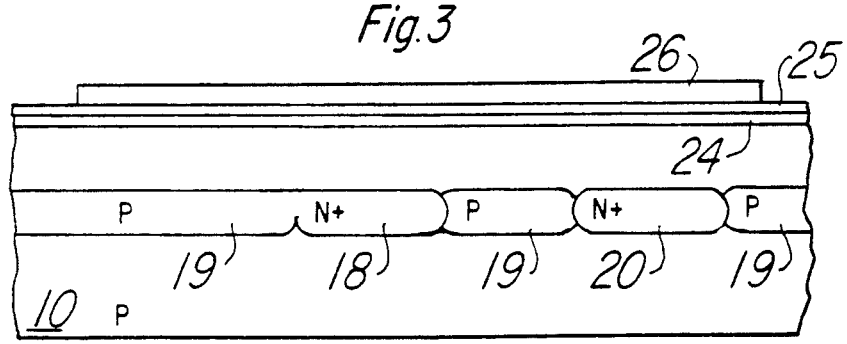
Figure 5:
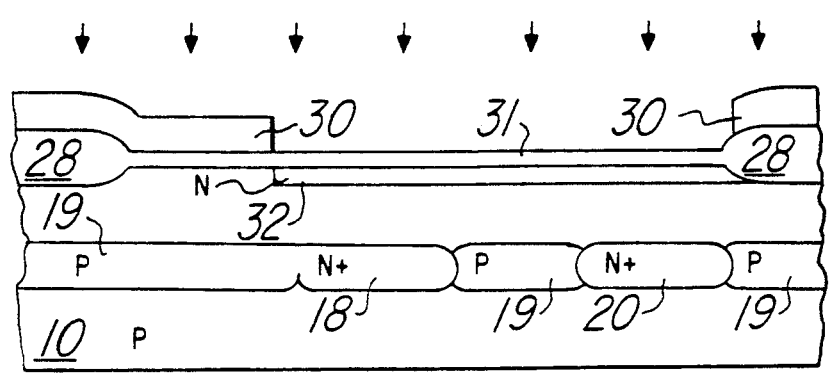

Silicon dioxide layer 24 is formed to a thickness of approximately 100 Angstroms on the surface of layer 22 using thermal oxidation. A layer of polycrystalline silicon 25 is then deposited using LPCVD to a thickness of approximately 500 Angstroms. A layer of silicon nitride 26 is then deposited using LPCVD to a thickness of approximately 2,400 Angstroms. Silicon nitride layer 26, polycrystalline silicon layer 25 and silicon dioxide layer 24 are then patterned using common photolithographic and etching techniques. The structure of FIG. 4 is then subjected to thermal oxidation in a steam ambient at a pressure of approximately 10 atmospheres for approximately 52 minutes to form thick field oxide regions 28 to a thickness of approximately 8,000 Angstroms. The resulting structure is shown in FIG. 5. The process used in the formation of field oxide regions 28 is known as poly buffered LOCOS and is more fully explained in Havemann, et al., U.S. Pat. No. 4,541,167, which is assigned to the assignee of this application and hereby incorporated by reference. Silicon nitride layer 26, polycrystalline silicon layer 25 and silicon dioxide layer 24 are then removed using common wet etching techniques. A layer of silicon dioxide 31 is then regrown by thermal oxidation to a thickness of approximately 250 Angstroms where epitaxial layer 22 is exposed. A layer of photoresist 30 is then deposited and patterned to provide an ion implantation mask. A implantation of arsenic then performed at a density of approximately $2 \times 10^{15}$ ions per centimeter$^2$ at an energy of approximately 50 kiloelectron volts. Alternatively a double implantation of arsenic and phophorous ions may be performed as more fully described in Haken, et al., U.S. Pat. No. 4,851,360, issued Jul. 25, 1989, assigned to the assignee of this application and hereby incorporated by reference. After removing photoresist layer 30 using conventional ashing techniques, these ion implantations are driven in to form diffused region 32 as shown in FIG. 5.

Figure 6:
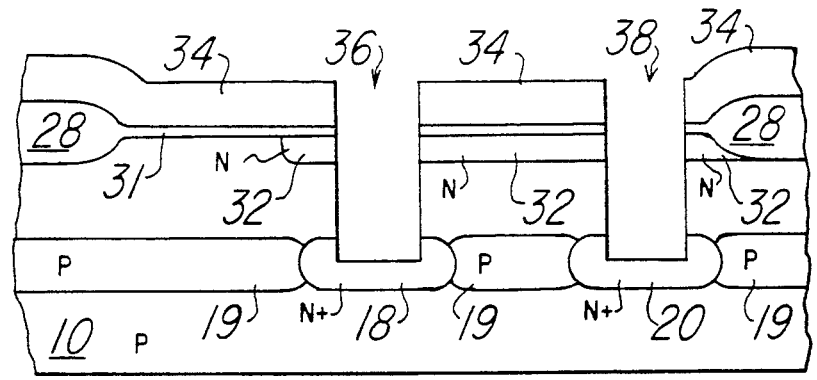
Figure 7:
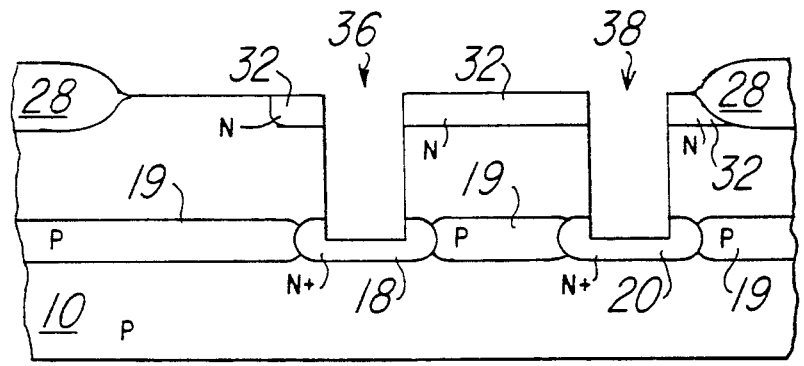
Figure 8:
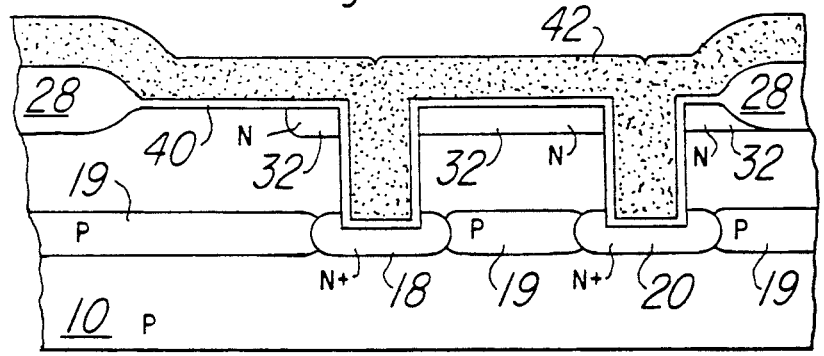

A layer of silicon dioxide 34 is then deposited, patterned and hardened using thermal hardening processes on the surface of the structure of FIG. 5. Silicon dioxide layer 34 then serves as a hard mask for etching trenches 36 and 38 as shown in FIG. 6. Trenches 36 and 38 extend into N+ regions 18 and 20, respectively. An example of a suitable etching technique can be found in U.S. Pat. No. 4,784,720, issued to Douglas, titled "Trench Etch Process for a Single-Wafer RIE Dry Etch Reactor", issued Nov. 15, 1988 and assigned to the assignee of this application. Silicon dioxide layer 34 is then removed using an isotropic etching technique such as wet etching in buffered hydrofluoric acid. During the process of the removal of silicon dioxide layer 34, silicon dioxide layer 31 is also removed. The etching process for the removal of silicon dioxide layer 34 and silicon dioxide layer 31 is controlled so that thick silicon dioxide regions 28 remain. The resulting structure is shown in FIG. 7. Silicon dioxide layer 40 is then thermally grown on the structure of FIG. 7 as shown in FIG. 8. During this thermal oxidation process, silicon dioxide layer 40 will be thicker where adjacent to N type region 32 and N+ regions 18 and 20. This increased thickness is not shown for the purpose of clarity. The polycrystalline silicon layer 42 is then deposited on the surface of the structure of FIG. 8 to a thickness of approximately 5,500 Angstroms using low pressure chemical vapor deposition. Polycrystalline silicon layer 42 is doped using in situ doping to provide a resistivity of approximately 30 Ohms per square.

Figure 9:
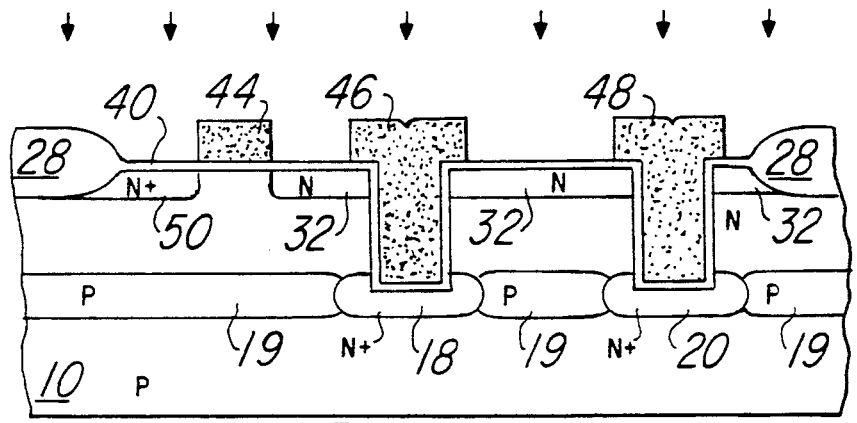
Figure 10:
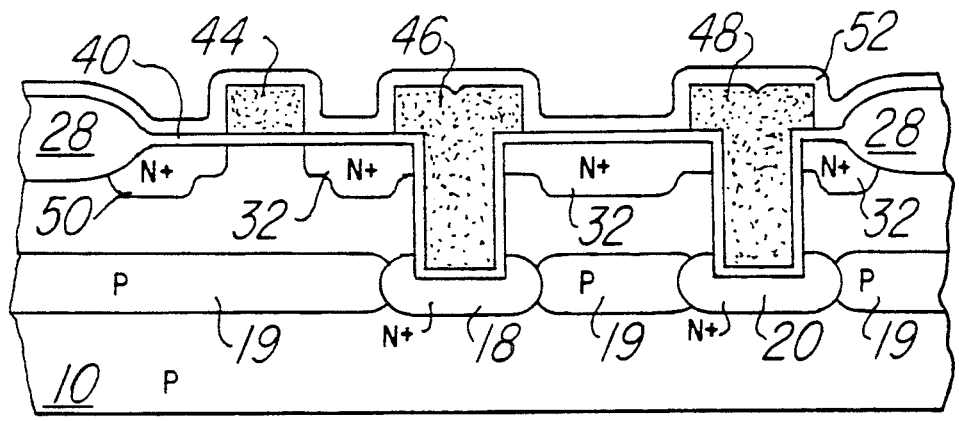

Polycrystalline silicon layer 42 is then patterned to provide gate 44, 46 and 48 as shown in FIG. 9. Gates 44, 46 and 48 are used as an ion implantation mask for phosphorus ions having a density of approximately $2 \times 10^{13}$ ions per centimeter$^2$ and an energy of approximately 80 kiloelectron volts. This provides the lightly doped drain portions of N drain 50 and N region 32 to provide N regions as shown in FIG. 9. A layer of silicon dioxide 52 is then deposited in the surface of the structure of FIG. 9 using low pressure chemical vapor deposition to provide layer 52 as shown in FIG. 10. The structure of FIG. 10 is then subjected to an anisotropic etching process such as reactive ion etching using carbon tetrafluoride. This etching step removes the portions of silicon dioxide layer 40 not protected by gates 44, 46 and 48 and provides sidewall oxide regions 54 on the sides of gates 44, 46 and 48. A double ion implantation is then performed. Arsenic ions are implanted at an energy of approximately 150 kiloelectron volts and a density of approximately $3 \times 10^{15}$. Phosphorus ions are implanted at an energy of approximately 95 kiloelectron volts and a density of approximately $4 \times 10^{14}$. These implantations complete the formation of N+ regions 32 and 50.

A layer of titanium is then deposited by sputtering to provide titanium layer 56 as shown in FIG. 11. The structure of FIG. 11 is then heated in a nitrogen ambient to cause reaction between titanium layer 56 and the exposed portions of diffusions 50 and 32 to form titanium silicide layers 58 as shown in FIG. 12. During the formation of titanium silicide layers 58, the portion of titanium layer 56 which does not react with the silicon in diffusions 50 and 32 converts to titanium nitride. Titanium nitride can then be patterned and etched to be removed where unwanted and to be left in place where a local interconnect is required as exemplified by local interconnect 60 as shown in FIG. 12. Further details showing a method for forming a local interconnect structure is shown in U.S. Pat. No. 4,821,085, issued to Haken, et al., titled "VLSI Local Interconnect Structure", issued Apr. 11, 1989 and assigned to the assignee of this application. This patent is hereby incorporated herein by reference.

The side views depicted in FIGS. 1 through 12 are shown along cut away AA of FIG. 13. FIG. 13 is a plan view diagram showing the portion of the integrated circuit fabricated as shown in FIG. 12 plus parallel structures showing a completed bi-stable logic device suitable for use as an SRAM cell. Diffusion 132 is formed using the same processing steps used to fabricate diffusion 32. Diffusion 150 is fabricated using the processing steps used to fabricate diffusion 50. Gates 146 and 148 are fabricated using the processing steps used to fabricate gates 46 and 48. Polycrystalline silicon extensions 151 and 152 are patterned during the patterning of polycrystalline layer 42 as described with regard to FIGS. 8 and 9 previously. Local interconnects 160 and 162 are fabricated using the same processing steps used to fabricate local interconnect 60 as described with regard to FIG. 12.

FIG. 14 is a schematic diagram showing the electrical characteristics of the structure shown in FIG. 13. Like numbered components illustrate the electrical operation of corresponding components from FIG. 13 to FIG. 14. As can be seen, transistors L1 and L2 comprise gate strapped load transistors and transistors D1 and D2 function as driver transistors. Transistors L1 and L2 operates as subthreshold load transistors. Transistors WR1 and WR2 provide write access. WR1 provides access to N diffusion 32 for bitline $\overline{BL}$ and WR2 provides access to N diffusion 132 for bitline BL. In another embodiment of the present invention, a vertical resistor is used to replace load devices 48 and 148 of FIG. 14.

FIG. 15 is a side view schematic diagram showing an intermediate processing step in the formation of vertical resistors for the present embodiment. Field oxide regions 228, P regions 219, N+ region 220 and silicon nitride layer, 226 are formed using the corresponding steps previously described for forming P region 19, N+ region 20, field oxide region 28 and silicon nitride layer 226 in FIGS. 1 through 12. A trench is etched through field oxide region 228 to N+ region 120 using the processing steps described in Douglas, et al., supra. The structure of FIG. 15 is then subjected to a thermal oxidation form silicon dioxide layers 240 to a thickness of approximately 500 Angstroms, as shown in FIG. 15. The structure of FIG. 15 is then subjected to an anisotropic oxide etching process to leave the portion of silicon dioxide layers 240, shown in FIG. 16. Note that the bottom part of the trench is cleared of silicon dioxide layer 240. Note that in the processing steps of the described embodiment, silicon nitride layer 226 remains over remote regions. A layer of polycrystalline silicon is then deposited overall to a thickness of approximately 5,500 Angstroms in order to fill trench 229. The polycrystalline silicon layer 248 is then etched to provide the structure shown in FIG. 17. Polycrystalline silicon layer 248 is undoped or very lightly doped polycrystalline silicon, thus having a high resistance. Resistor 249 may be used to replace transistor L1 or L2 of FIG. 14. The resulting structure is shown in FIG. 18. Another process for forming this structure is shown in copending application Ser. No. (TI-14396). In another embodiment loads L1 and L2 may be formed in an N-well with a buried P+ layer and a surface P+ diffusion to provide P-channel transistors for a CMOS cell. Another embodiment may be a transistor using a polycrystalline layer in a trench as a channel region with another conductor formed in the trench controlling current through the poly channel. This poly transistor may be a P-channel or N-channel transistor. In other embodiments, any suitable load device, active or passive, may be used.

Another embodiment of the present invention is shown in FIG. 19 in side view. Resistor 249 is connected between the surface of the integrated circuit to buried node 250. Resistor 249 is formed using the processing steps described with regard to FIGS. 15 through 17. Also fabricated using the processing steps described with regard to FIGS. 15 through 17 is connection C1. The difference between a connection C1 and resistor 249 is that polycrystalline silicon plug 252 is formed of heavily doped N+ type silicon providing a highly conductive connection between the surface of the integrated circuit and buried node 250. Transfer transistor WR1 and driver transistor D1 are fabricated using the processing steps described with regard to FIGS. 1 through 12. The four elements shown in FIG. 18 provide one inverter which is half a bi-stable device. FIG. 20 is a plan view diagram showing the structure of FIG. 19 as the indicated cutaways 19 plus the completion of the bi-stable device with the inclusion of driver D2, connector D2, load device 249 and write transistor WR2. As can be seen from FIG. 20, connectors C1 and C2 provide cross coupling between the gates of driver transistors D1 and D2 to the buried nodes of the opposite inverters of the bi-stable device. Local interconnections 272 and 274 connect the gate of driver transistor D1 to connection C2 and the gate of driver transistor D2 to connection C1, respectively. Word line WL runs the length of the array and connects the gates of write transistors WR1 and WR2. $V_{dd}$ supply line 270 runs parallel to word line WL and is connected to a source of positive potential. Drains 232 of drivers D1 and D2 are connected to ground or a reference potential. The drains of write transistors WR1 and WR2 are connected to BL and $\overline{BL}$. A schematic diagram of the structure shown in FIG. 20 is shown in FIG. 21.

Although the described embodiments of the present invention are described for use as a static random access memory cell, the applicability of the invention is not so limited. For example, by removing transistors WR1 and WR2, a simple latch is available for use in all circuit situations where a latch is appropriate. Examples of where a latch may be useful are in flip-flop circuits, delay circuits, storage registers, etc. The present invention will find many embodiments upon analysis of the present specification by those skilled in the art. The scope of the present invention is only limited by the claims appended hereto.

What is claimed is:

1. A bi-stable logic device comprising:
   a first doped region having a first conductivity type formed in the surface of a substrate having a second conductivity type;
   a second doped region having said first conductivity type formed in said surface of said substrate, said second doped region being separate from said first doped region;
   a first buried doped region having said first conductivity type formed in said substrate below said surface, said first buried doped region being separate from said first and second doped regions, said first buried doped region being connected to a first reference potential;
   a second buried doped region having said first conductivity type formed in said substrate below said surface, said second buried doped region being separate from said first, second and first buried doped regions, said second buried doped region being connected to a second reference potential;
   a first trench formed in said substrate extending from said first doped region to said first buried doped region;
   a first gate formed in said first trench, said first gate controlling conductivity between said first and first buried doped regions;
   a second trench formed in said substrate extending from said first doped region to said second buried doped region;
   a second gate formed in said second trench, said second gate controlling the conductivity of said substrate between said first doped region and said second buried doped region;
   a third trench formed in said substrate extending from said second doped region to said first buried doped region;
   a third gate formed in said third trench, said third gate controlling the conductivity of said substrate between said second doped region and said first buried doped region;
   a fourth trench formed in said substrate, said fourth trench extending from said second doped region to said second buried doped region;
   a fourth gate formed in said fourth trench, said fourth gate controlling the conductivity of said substrate between said second and said second buried doped regions;
   a first conductor electrically connecting said first and fourth gates to said second doped region; and
   a second conductor electrically connecting said second and third gates to said first doped region.

2. A device as in claim 1 further comprising:
   a fifth doped region having said first conductivity type formed in said substrate, said fifth doped region being separate from said first doped region and defining a first channel region;
   a fifth gate formed on the surface of said substrate controlling the conductivity of said first channel region;
   a sixth doped region having said first conductivity type formed in said substrate, said fifth doped region being separate from said second doped region and defining a second channel region; and
   a sixth gate formed on the surface of said substrate controlling the conductivity of said second channel region.

3. A device as in claim 1 wherein said substrate comprises crystalline silicon.

4. A device as in claim 2 wherein said substrate comprises crystalline silicon.

5. A device as in claim 2 wherein said fifth and sixth gates are electrically connected.

6. A device as in claim 1 wherein said first, second, third and fourth gates comprise polycrystalline silicon.

7. A device as in claim 2 wherein said first, second, third, fourth, fifth and sixth gates comprise polycrystalline silicon.

8. A device as in claim 1 wherein said first, second, third and fourth gates comprise polycrystalline silicon on a dielectric layer.

9. A device as in claim 2 wherein said first, second, third, fourth, fifth and sixth gates comprise polycrystalline silicon on a dielectric layer.

10. A bi-stable logic device comprising:
    a first doped region having a first conductivity type formed in the surface of a substrate having a second conductivity type;
    a second doped region having said first conductivity type formed in said surface of said substrate, said second doped region being separate from said first doped region;
    a first buried doped region having said first conductivity type formed in said substrate below said surface, said first buried doped region being separate from said first and second doped regions, said first buried doped region being connected to a first reference potential;
    a second buried doped region having said first conductivity type formed in said substrate below said surface, said fourth doped region being separate from said first, second and first buried doped regions, said second buried doped region being connected to a second reference potential;
    a first trench formed in said substrate in said first area and extending from said first doped region to said first buried doped region;
    a first gate formed in said first trench, said first gate controlling conductivity between said first and first buried doped regions;
    a second trench formed in said substrate extending to said second buried doped region;
    a first resistor formed in said second trench, said first resistor providing a resistive connection to said second buried doped region;
    a third trench formed in said substrate extending from said second doped region to said first buried doped region;
    a second gate formed in said third trench, said second gate controlling the conductivity of said substrate between said second doped region and said first buried doped region;
    a fourth trench formed in said substrate, said fourth trench extending to said second buried doped region;
    a second resistor formed in said fourth trench, said second resistor providing resistive connection to said second buried doped regions;
    a first conductor electrically connecting said first gate and said first resistor to said second doped region; and
    a second conductor electrically connecting said second gate and said second resistor to said first doped region.

11. A device as in claim 10 further comprising:

a fifth doped region having said first conductivity type formed in said substrate, said fifth doped region being separate from said first doped region and defining a first channel region;

a fifth gate formed on the surface of said substrate controlling the conductivity of said first channel region;

a sixth doped region having said first conductivity type formed in said substrate, said fifth doped region being separate from said second doped region and defining a second channel region; and a sixth gate formed on the surface of said substrate controlling the conductivity of said second channel region.

12. A device as in claim 10 wherein said substrate comprises crystalline silicon.

13. A device as in claim 11 wherein said substrate comprises crystalline silicon.

14. A device as in claim 11 wherein said fifth and sixth gates are electrically connected.

15. A device as in claim 10 wherein said first and second gates, and said first and second resistors comprise polycrystalline silicon.

16. A device as in claim 11 wherein said first, second, fifth and sixth gates, and said first and second resistors comprise polycrystalline silicon.

17. A device as in claim 10 wherein said first and second gates comprise polycrystalline silicon on a dielectric layer.

18. A device as in claim 11 wherein said first, second, fifth and sixth gates comprise polycrystalline silicon on a dielectric layer.

19. A bi-stable logic device comprising:
a first doped region having a first conductivity type formed in the surface of a substrate having a second conductivity type;
a second doped region having said first conductivity type formed in said surface of said substrate, said second doped region being separate from said first doped region;
a first buried doped region having said first conductivity type formed in said substrate below said surface, said first buried doped region being separate from said first and second doped regions, said first buried doped region being connected to a first reference potential;
a second buried doped region having said first conductivity type formed in said substrate below said surface, said second buried doped region being separate from said first, second and first buried doped regions, said second buried doped region being connected to a second reference potential;
a first trench formed in said substrate extending from said first doped region to said first buried doped region;
a first gate formed in said first trench, said first gate controlling conductivity between said first and first buried doped regions;
a second trench formed in said substrate extending from said first doped region to said second buried doped region;
a first channel layer formed in said second trench connected at one end to said first doped region and at the other end to said second buried doped region;
a second gate formed in said second trench and over said first channel layer, said second gate controlling the conductivity of said first channel layer;

a third trench formed in said substrate extending from said second doped region to said first buried doped region;

a third gate formed in said third trench, said third gate controlling the conductivity of said substrate between said second doped region and said first buried doped region;

a fourth trench formed in said substrate, said fourth trench extending from said second doped region to said second buried doped region;

a second channel layer formed in said fourth trench connected at one end to said second doped region and a the other end to said second buried doped region;

a fourth gate formed in said fourth trench and over said second channel layer, said fourth gate controlling the conductivity of said second channel layer;

a first conductor electrically connecting said first and second gates to said second doped region; and a second conductor electrically connecting said third and fourth gates to said first doped region.

20. A device as in claim 19 wherein said first channel layer and said second channel layer comprise polycrystalline silicon.

21. A device as in claim 19 further comprising:
a fifth doped region having said first conductivity type formed in said substrate, said fifth doped region being separate from said first doped region and defining a first channel region;
a fifth gate formed on the surface of said substrate controlling the conductivity of said first channel region;
a sixth doped region having said first conductivity type formed in said substrate, said fifth doped region being separate from said second doped region and defining a second channel region; and
a sixth gate formed on the surface of said substrate controlling the conductivity of said second channel region.

22. A device as in claim 19 wherein said substrate comprises crystalline silicon.

23. A device as in claim 21 wherein said first channel layer and said second channel layer comprise polycrystalline silicon.

24. A device as in claim 21 wherein said substrate comprises crystalline silicon.

25. A device as in claim 21 wherein said fifth and sixth gates are electrically connected.

26. A device as in claim 19 wherein said first, second, third and fourth gates comprise polycrystalline silicon.

27. A device as in claim 21 wherein said first, second, third, fourth, fifth and sixth gates comprise polycrystalline silicon.

28. A device as in claim 19 wherein said first, second, third and fourth gates comprise polycrystalline silicon on a dielectric layer.

29. A device as in claim 21 wherein said first, second, third, fourth, fifth and sixth gates comprise polycrystalline silicon on a dielectric layer.

30. A random access memory device comprising:
a plurality of memory cells arranged in a regular array, each cell comprising:
a first doped region having a first conductivity type formed in the surface of a substrate having a second conductivity type;
a second doped region having said first conductivity type formed in said surface of said substrate, said second doped region being separate from said first doped region;

a first buried doped region having said first conductivity type formed in said substrate below said surface, said first buried doped region being separate from said first and second doped regions, said first buried doped region being connected to a first reference potential;

a second buried doped region having said first conductivity type formed in said substrate below said surface, said second buried doped region being separate from said first, second and first buried doped regions, said second buried doped region being connected to a second reference potential;

a first trench formed in said substrate extending from said first doped region to said first buried doped region;

a first gate formed in said first trench, said first gate controlling conductivity between said first and first buried doped regions;

a second trench formed in said substrate extending from said first doped region to said second buried doped region;

a second gate formed in said second trench, said second gate controlling the conductivity of said substrate between said first doped region and said second buried doped region;

a third trench formed in said substrate extending from said second doped region to said first buried doped region;

a third gate formed in said third trench, said third gate controlling the conductivity of said substrate between said second doped region and said first buried doped region;

a fourth trench formed in said substrate extending from said second doped region to said second buried doped region;

a fourth gate formed in said fourth trench, said fourth gate controlling the conductivity of said substrate between said second and said second buried doped regions;

a first conductor electrically connecting said first and fourth gates to said second doped region; and a second conductor electrically connecting said second and third gates to said first doped region;

wherein said first and second buried doped regions extend the width of said array.

31. A device as in claim 30, each cell further comprising:

a fifth doped region having said first conductivity type formed, said fifth doped region being separate from said first doped region and defining a first channel region;

a fifth gate formed on the surface of said substrate controlling the conductivity of said first channel region;

a sixth doped region having said first conductivity type formed, said fifth doped region being separate from said second doped region and defining a second channel region; and a sixth gate formed on the surface of said substrate controlling the conductivity of said second channel region.

32. A device as in claim 30 wherein said substrate comprises crystalline silicon.

33. A device as in claim 31 wherein said substrate comprises crystalline silicon.

34. A device as in claim 31 wherein said fifth and sixth gates are electrically connected by a conductive word line extending the width of the array.

35. A device as in claim 30 wherein said first, second, third and fourth gates comprise polycrystalline silicon.

36. A device as in claim 31 wherein said first, second, third, fourth, fifth and sixth gates comprise polycrystalline silicon.

37. A device as in claim 30 wherein said first, second, third and fourth gates comprise polycrystalline silicon on a dielectric layer.

38. A device as in claim 31 wherein said first, second, third, fourth, fifth and sixth gates comprise polycrystalline silicon on a dielectric layer.

39. A bistable logic circuit, comprising:

a first buried doped region of a first conductivity type formed in a substrate of a second conductivity type, said first buried doped region being spaced from a surface of said substrate;

a second buried doped region of said first conductivity type formed in said substrate, said second buried doped region being spaced from said surface of said substrate;

a first vertical transistor located having a first current handling terminal connected to said first buried doped region, a second current handling terminal extending to said surface of said substrate, said second current handling terminal being connected to a first reference potential, and a control terminal controlling current between said first and second current handling terminals, said control terminal being connected to said second buried doped region;

a second vertical transistor located having a first current handling terminal connected to said second buried doped region, a second current handling terminal extending to said surface of said substrate, said second current handling terminal being connected to said first reference potential, and a control terminal controlling current between said first and second current handling terminals, said control terminal being connected to said first buried doped region;

a first load device extending between a first terminal connected to said first buried doped region and a second terminal at said surface and said second terminal being connected to a second reference potential; and a second load device extending between a first terminal connected to said second buried doped region and a second terminal at said surface and said second terminal being connected to said second reference potential.

40. A device as in claim 39 further comprising:

a first vertical access transistor having a first current handling terminal connected to said second buried doped region, a second current handling terminal serving as a second output terminal and a control terminal for receiving a second control access signal.

41. A device as in claim 40 wherein said first control access signal and said second control access signal are the same signal.

42. A device as in claim 39 wherein said first and second load devices comprise resistors.

43. A device as in claim 39 wherein said first and second load devices comprise field effect transistors.

44. A device as in claim 39 wherein said first and second load devices comprise field effect transistors having opposite conductivity type to said first and second transistors.

45. A device as in claim 39 wherein said first and second load devices comprise field effect transistors having a channel region in a polycrytalline layer.

46. A random access memory device comprising:
a plurality of bitlines formed on a substrate, said bitlines running substantially parallel to one another;
a plurality of memory cells each of said memory cell being connected to two bitlines and one wordline, and each of said memory cells comprising:
a first buried doped region of a first conductivity type formed in a substrate of a second conductivity type, said first buried doped region being spaced from a surface of said substrate;
a second buried doped region of said first conductivity type formed in said substrate, said second buried doped region being spaced from said surface of said substrate;
a first vertical transistor having a first current handling terminal connected to said first buried doped region, a second current handling terminal extending to said surface of said substrate, said second current handling terminal being connected to a first reference potential, and a control terminal controlling current between said first and second current handling terminals, said control terminal being connected to said second buried doped region;
a second vertical transistor having a first current handling terminal connected to said second buried doped region, a second current handling terminal extending to said surface of said substrate, said second current handling terminal being connected to said first reference potential, and a control terminal controlling current between said first and second current handling terminals, said control terminal being connected to said first buried doped region;
a first load device having a first terminal connected to said first buried doped region and a second terminal extending to said surface and said second terminal being connected to a second reference potential;
a second load device having a first terminal connected to said second buried doped region and a second terminal extending to said surface and said second surface terminal being connected to said second reference potential;
a first vertical access transistor having a first current handling terminal connected to said first buried doped region, a second current handling terminal connected to one of said two bitlines and a control terminal connected to said wordline; and
a second vertical access transistor having a first current handling terminal connected to said second buried doped region, a second current handling terminal connected to the other of said two bitlines and a control terminal connected to said wordline.

47. A device as in claim 46 wherein said first and second load devices comprise resistors.

48. A device as in claim 46 wherein said first and second load devices comprise field effect transistors.

49. A device as in claim 46 wherein said first and second load devices comprise field effect transistors having opposite conductivity type to said first and second transistors.

50. A device as in claim 46 wherein said first and second load devices comprise field effect transistors having a channel region in a polycrytalline silicon layer.

51. A bistable logic device comprising:
a first buried doped region of a first conductivity type formed in a substrate of a second conductivity type, said first buried doped region being spaced from a surface of said substrate;
a second buried doped region of said first conductivity type formed in said substrate, said second buried doped region being spaced from said surface of said substrate;
a first transistor formed in a trench formed in said substrate extending to said first buried doped region, a gate insulating layer formed on the surfaces of said trench, a doped drain region formed in said substrate at said surface adjacent to said trench, said doped drain region being connected to a first reference potential, a gate formed in said trench on said insulating layer, said gate being electrically connected to said second buried doped region;
a second transistor formed in a trench formed in said substrate extending to said second buried doped region, a gate insulating layer formed on the surfaces of said trench, a doped drain region formed in said substrate at said surface adjacent to said trench, said doped drain region being connected to a first reference potential, a gate formed in said trench on said insulating layer, said gate being electrically connected to said first buried doped region;
a first load device formed in a trench extending from said surface to said first buried doped region, an insulating layer formed on the sidewalls of said trench and resistive material formed in said trench being connected to a second reference potential at said surface; and
a second load device formed in a trench extending from said surface to said second buried doped region, an insulating layer formed on the sidewalls of said trench and resistive material formed in said trench being connected to said second reference potential at said surface.

52. A device as in claim 51 wherein said resistive material is undoped polycrystalline silicon.

53. A device as in claim 51 wherein
said connection from said gate of said first transistor to said second buried doped region comprises a trench extending from said surface to said second buried doped region, an insulating layer formed on the sidewalls of said trench, conductive material filling the remainder of said trench and a conductor extending from said conductive material at the top of said trench to said gate of said first transistor; and
said connection from said gate of said second transistor to said first buried doped region comprises a trench extending from said surface to said second buried doped region, an insulating layer formed on the sidewalls of said trench, conductive material filling the remainder of said trench and a conductor extending from said conductive material at the top of said trench to said gate of said second first transistor.

54. A device as in claim 51 further comprising:
a first access transistor formed in a trench extending from said surface to said first buried doped region, a gate insulating layer formed on the surfaces of said trench, a doped drain region formed in said substrate at said surface adjacent to said trench, said doped drain region serving as a first output terminal and a gate formed on said gate insulating layer serving as a control terminal for receiving a first control access signal;

a second access transistor formed in a trench extending from said surface to said second buried doped region, a gate insulating layer formed on the surfaces of said trench, a doped drain region formed in said substrate at said surface adjacent to said trench, said doped drain region serving as a second output terminal and a gate formed on said gate insulating layer serving as a control terminal for receiving a second control access signal.

55. A device as in claim 54 wherein said first control access signal and said second control access signal are the same signal.

56. A random access memory device comprising:
a plurality of bitlines formed on a substrate, said bitlines running substantially parallel to one another;
a plurality of wordlines running substantially parallel to said bitlines; and
a plurality of memory cells each of said memory cells being connected to two bitlines and one wordline, and each of said memory cells comprising:
a first buried doped region of a first conductivity type formed in a substrate of a second conductivity type, said first buried doped region being spaced from a surface of said substrate;
a second buried doped region of said first conductivity type formed in said substrate, said second buried doped region being spaced from said surface of said substrate; a first transistor formed in a trench formed in said substrate extending to said first buried doped region, a gate insulating layer formed on the surfaces of said trench, a doped drain region formed in said substrate at said surface adjacent to said trench, said doped drain region being connected to a first reference potential, a gate formed in said trench on said insulating layer, said gate being electrically connected to said second buried doped region;
a second transistor formed in a trench formed in said substrate extending to said second buried doped region, a gate insulating layer formed on the surfaces of said trench, a doped drain region formed in said substrate at said surface adjacent to said trench, said doped drain region being connected to a first reference potential, a gate formed in aid trench on said insulating layer, said gate being electrically connected to said first buried doped region; a first load device formed in a trench extending from said surface to said first buried doped region, an insulating layer formed on the sidewalls of said trench and resistive material formed in said trench being connected to a second reference potential at said surface;

a second load device formed in a trench extending from said surface to said second buried doped region, an insulating layer formed on the sidewalls of said trench and resistive material formed in said trench being connected to said second reference potential at said surface;

a first access transistor formed in a trench extending from said surface to said first buried doped region, a gate insulating layer formed on the surfaces of said trench, a doped drain region formed in said substrate at said surface adjacent to said trench, said doped drain region being connected to one of said two bitlines, and a gate formed on said gate insulating layer connected to said wordline; and a second access transistor formed in a trench extending from said surface to said second buried doped region, a gate insulating layer formed on the surfaces of said trench, a doped drain region formed in said substrate at said surface adjacent to said trench said doped drain region being connected to one of said two bitlines and a gate formed on said gate insulating layer being connected to said wordline.

57. A device as in claim 56 wherein said resistive material is undoped polycrystalline silicon.

58. A device as in claim 56 wherein
said connection from said gate of said first transistor to said second buried doped region comprises a trench extending from said surface to said second buried doped region, an insulating layer formed on the sidewalls of said trench, conductive material filling the remainder of said trench and a conductor extending from said conductive material at the top of said trench to said gate of said first transistor; and said connection from said gate of said second transistor to said first buried doped region comprises a trench extending from said surface to said second buried doped region, an insulating layer formed on the sidewalls of said trench, conductive material filling the remainder of said trench and a conductor extending from said conductive material at the top of said trench to said gate of said second first transistor.

* * * * *